(12) United States Patent
Albuquerque et al.

(10) Patent No.: US 7,936,448 B2
(45) Date of Patent: May 3, 2011

(54) LIDAR SYSTEM UTILIZING SOI-BASED OPTO-ELECTRONIC COMPONENTS

(75) Inventors: Vijay Albuquerque, Palo Alto, CA (US); David Plede, Allentown, PA (US)

(73) Assignee: Lightwire Inc., Allentown, PA (US)

( * ) Notice: Subject to any disclaimer, the term of this patent is extended or adjusted under 35 U.S.C. 154(b) by 1135 days.

(21) Appl. No.: 11/657,139

(22) Filed: Jan. 24, 2007

(65) Prior Publication Data

US 2010/0271614 A1    Oct. 28, 2010

Related U.S. Application Data

(60) Provisional application No. 60/762,994, filed on Jan. 27, 2006.

(51) Int. Cl.
*G01C 3/08* (2006.01)
(52) U.S. Cl. .................................. 356/4.01; 356/5.01
(58) Field of Classification Search .............. 356/4.01, 356/5.01, 28
See application file for complete search history.

(56) References Cited

U.S. PATENT DOCUMENTS

| | | | |
|---|---|---|---|
| 5,221,956 A | | 6/1993 | Patterson et al. |
| 5,587,785 A | * | 12/1996 | Kato et al. .................. 356/28.5 |
| 5,778,019 A | * | 7/1998 | Churnside et al. |
| 5,822,047 A | * | 10/1998 | Contarino et al. |
| 5,854,867 A | | 12/1998 | Lee et al. |
| 6,433,860 B1 | * | 8/2002 | Ohishi .................. 356/5.01 |
| 6,441,889 B1 | * | 8/2002 | Patterson |
| 6,593,582 B2 | * | 7/2003 | Lee et al. |
| 6,636,669 B1 | * | 10/2003 | Chin et al. |
| 6,654,401 B2 | * | 11/2003 | Cavalheiro Vieira et al. |
| 6,683,894 B1 | | 1/2004 | Lee et al. |
| 7,065,272 B2 | * | 6/2006 | Tallaert et al. |
| 7,102,751 B2 | * | 9/2006 | Harper |
| 7,679,728 B2 | * | 3/2010 | Kurokawa .................. 356/4.01 |
| 2002/0110077 A1 | | 8/2002 | Drobot et al. |
| 2002/0145787 A1 | | 10/2002 | Shpantzer et al. |
| 2004/0232430 A1 | * | 11/2004 | Lempkowski et al. |
| 2005/0179888 A1 | * | 8/2005 | Kallio |
| 2005/0187701 A1 | | 8/2005 | Baney |
| 2006/0171626 A1 | | 8/2006 | McNie et al. |
| 2006/0231771 A1 | * | 10/2006 | Lee et al. |
| 2006/0232762 A1 | * | 10/2006 | Jokinen .................. 356/5.01 |

* cited by examiner

*Primary Examiner* — Isam Alsomiri
(74) *Attorney, Agent, or Firm* — Wendy W. Koba

(57) ABSTRACT

A compact, integrated LIDAR system utilizes SOI-based opto-electronic components to provide for lower cost and higher reliability as compared to current LIDAR systems. Preferably, an SOI-based LIDAR transmitter and an SOI-based LIDAR receiver (both optical components and electrical components) are integrated within a single module. The various optical and electrical components are formed utilizing portions of the SOI layer and applying well-known CMOS fabrication processes (e.g., patterning, etching, doping), including the formation of additional layer(s) over the SOI layer to provide the required devices. A laser source itself is attached to the SOI arrangement and coupled through an integrated modulation device (such as a Mach-Zehnder interferometer, i.e., MZI) to provide the scanning laser output signal (the scan controlled by, for example, an electrical (encoder) input to the input to the MZI). The return, reflected optical signal is received by a photodetector integrated within the SOI arrangement, where it is thereafter converted into an electrical signal and subjected to various types of signal processing to perform the desired type(s) of signal characterization/signature analysis.

14 Claims, 8 Drawing Sheets

LIDAR SYSTEM UTILIZING SOI-BASED OPTO-ELECTRONIC COMPONENTS

CROSS-REFERENCE TO RELATED APPLICATION

This application claims the benefit of U.S. Provisional Application Ser. No. 60/762,994, filed Jan. 27, 2006.

TECHNICAL FIELD

The present invention is related to a "LIght Detection And Ranging" (LIDAR) system and, more particularly, to a compact, integrated LIDAR system utilizing SOI-based opto-electronic components to provide for lower cost and higher reliability as compared to current LIDAR systems.

BACKGROUND OF THE INVENTION

LIDAR systems are known to be utilized in a number of different arrangements including, but not limited to, "radar guns" as used by police to monitor traffic speeds, ground-based surveying, underwater scanning, airborne geo-mapping arrangements, aerosol monitoring, and the like. LIDAR systems may operate on the basis of various types of optical output signals, including continuous wave (CW) Doppler, pulsed Doppler, CW phase-shift keying (CW-PSK), pulsed PSK, and the like. In one exemplary arrangement, the LIDAR device emits a short pulse of infrared light that is directed in a narrow beam toward a selected target. The light pulse strikes the target and is typically reflected back towards the LIDAR device. This return energy is then captured by an optical receiving element and converted from light energy to an electrical signal. A high speed clock is used to determine the total trip time, which can then be used to calculate the range to the target. For speed calculations, multiple ranges are taken and the change in range over a short period of time is determined. Typically, police LIDAR speed guns and survey range finders use stripe array laser diode emitters to emit the pulse of infrared energy required to measure the distance to targets at significant ranges. The maximum range that a system can achieve is proportional to the amount of energy emitted per pulse by the laser. The amount of energy that is emitted from these lasers is typically limited by the laser safety regulations of the country where the LIDAR units are sold, impacting the maximum range over which these devices may be used.

LIDAR units are also starting to be used in automotive applications for driver assistance situations. Typically, these units have a range and field of view to detect objects, such as other automobiles, at an appropriate distance to take any necessary action, such as warning the driver or changing the speed of the automobile. In order to obtain the required field of view, prior art systems use two methods. One prior art LIDAR system consists of a phased array, which consists of several optical transmitting elements whose relative phase is adjusted to create a radiation pattern of constructive and destructive optical waves, forming a beam that can be electronically steered, by adjusting the phases of the individual optical transmitting elements. This phased array system is generally too expensive for use in the automotive environment.

In another arrangement, aerosol LIDAR systems may be used to detect aerosol clouds that may include biological weapon agents. In this case, multiple laser sources are used, operating at different wavelengths, to generate a large set of optical scattering data that is used to develop a "signature" of the aerosol and ascertain its chemical content. However, present technologies, owing to the complexity and laser power levels required for aerosol LIDAR, are limited in range and not well-suited for an in-the-field, portable detection system.

In these and other environments, therefore, a need remains for a LIDAR system that is relatively compact and portable, yet sufficiently precise for more complex applications.

SUMMARY OF THE INVENTION

The need remaining in the art is addressed by the present invention, which relates to a "LIght Detection And Ranging" (LIDAR) system and, more particularly, to a compact, integrated LIDAR system utilizing SOI-based opto-electronic components to provide for lower cost and higher reliability as compared to current LIDAR systems.

In one embodiment of the present invention, the various components of both a LIDAR transmitter and a LIDAR receiver (both optical components and electrical components) are integrated within a single module, based upon a silicon-on-insulator (SOI) arrangement. The SOI arrangement comprises a silicon substrate, an insulating layer formed over the substrate (the "buried oxide" layer), and a relatively thin (usually sub-micron in thickness) silicon surface layer (referred to in the art as the "SOI layer") disposed over the buried oxide layer. The various optical and electrical components are formed utilizing portions of the SOI layer and applying well-known CMOS fabrication processes (e.g., patterning, etching, doping), including the formation of additional layer(s) over the SOI layer to provide the required devices. A laser source itself is attached to the SOI arrangement and coupled through an integrated modulation device (such as a Mach-Zehnder interferometer, i.e., MZI) to provide the scanning laser output signal (the scan controlled by, for example, an electrical (encoder) input to the MZI). The return, reflected optical signal is received by a photodetector integrated within the SOI arrangement, where it is thereafter converted into an electrical signal and subjected to various types of signal processing to perform the desired type(s) of signal characterization/signature analysis.

In another embodiment of the present invention, the arrangement may be formed as a "multi-chip module", with the different sub-systems and/or components integrated within separate silicon substrates, with the various silicon substrates mounted on a single, common substrate for optical and electrical interconnection. In one case, all of the transmitting elements may be formed on one "module", with all of the receiving elements formed on another "module"; the two modules then supported on a common substrate and coupled to the required input and output optical/electrical signals. In another case, all of the electrical components (encoder, transimpedance amplifier and signal processor) may be formed on one substrate, with the active and passive optical devices formed as a separate module.

A LIDAR transmitter of the present invention may include an optical splitter and/or optical combiner (integral with the SOI substrate) to allow for the creation of a plurality of separate laser output signals, all from a signal input laser source and all formed as a monolithic arrangement on a single SOI substrate. A number of these SOI substrates may be used together, providing multiple laser paths and multiple signal processors, as is required for automatic cruise control (ACC) applications.

Other and further embodiments and advantages of the LIDAR system of the present invention will become apparent during the course of the following discussion and by reference to the accompanying diagrams.

BRIEF DESCRIPTION OF THE DRAWINGS

Referring now to the drawings.

DETAILED DESCRIPTION

Figure 1:
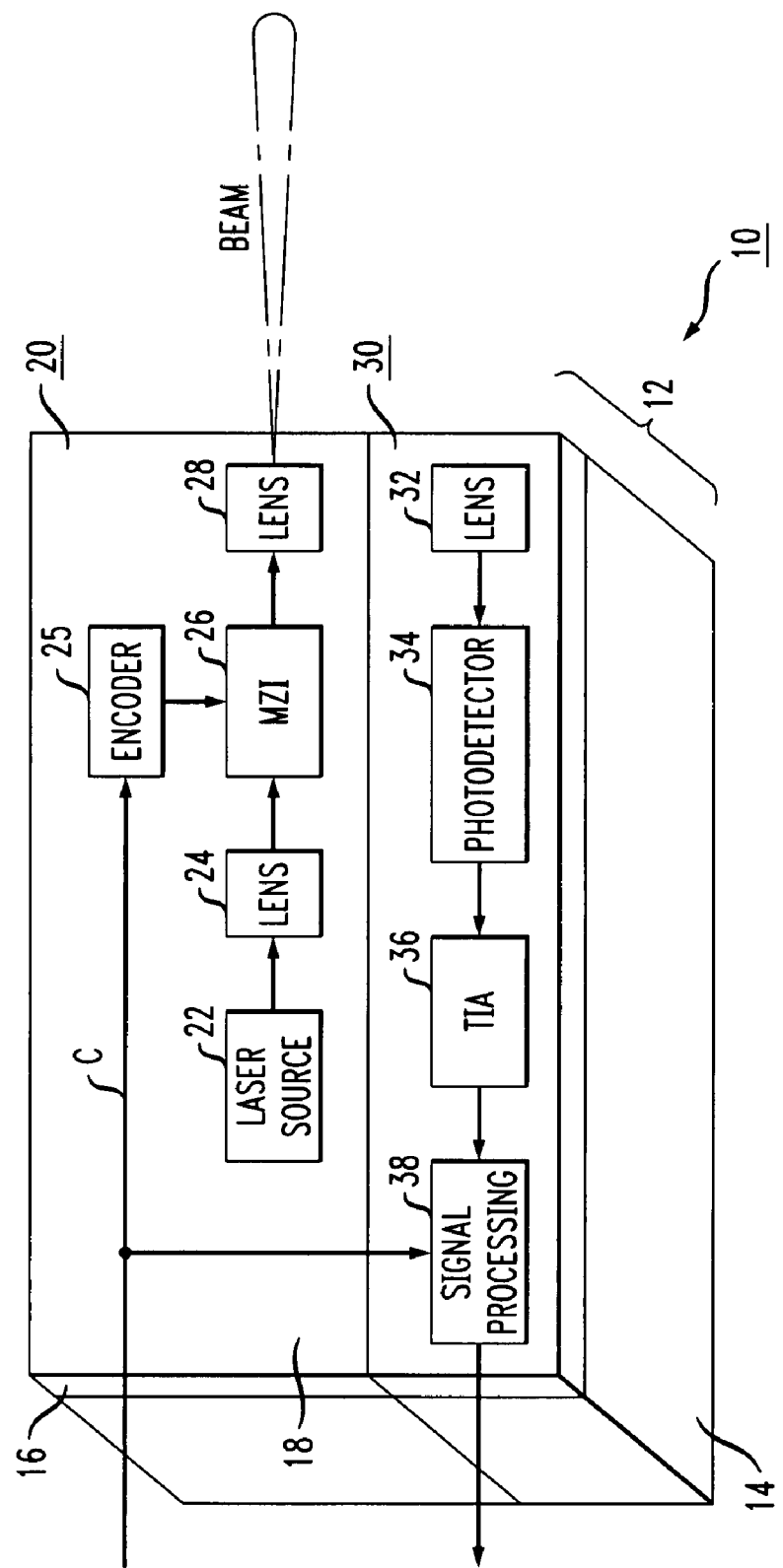
FIG. 1 is an isometric view of an exemplary LIDAR system integrated within an SOI-based platform in accordance with the present invention.

FIG. 1 illustrates, in an isometric view, an exemplary LIDAR system 10 integrated within an SOI-based platform in accordance with the present invention. In this particular embodiment, the various components of LIDAR system 10 are integrated within a single SOI structure 12. As will be discussed in other examples below, a "multi" module arrangement may also be utilized. Referring to FIG. 1 in particular, however, SOI structure 12 is illustrated as comprising a silicon substrate 14, an overlying insulating layer 16 (formed of a dielectric material, such as silicon dioxide and often referred to as the "buried oxide" layer), and a surface silicon layer 18 (hereinafter referred to as the "SOI layer"), where SOI layer 18 is generally of a sub-micron thickness.

LIDAR system 10 includes a LIDAR transmitter 20 and a LIDAR receiver 30, as shown in FIG. 1. LIDAR transmitter 20 includes a laser source 22, a focusing lens 24, an optical modulator 26 (such as, for example, a Mach-Zehnder interferometer), with an encoding/modulating electrical input from an encoder 25, and an output collimating lens 28 for out-coupling the modulated optical output signal from SOI structure 10 into "free space", or any other appropriate optical transmission medium. The optical output signal from LIDAR transmitter 20 is directed to a particular object ("target") that is being analyzed. LIDAR receiver 30 includes a receiving, focusing lens 32 for collecting a sufficient portion of the returned, reflected "free space" optical signal from the target, a photodetector 34 for converting the received optical signal into an electrical representation, a transimpedance amplifier 36 for converting the electrical signal into digital form, and a signal processor 38 (a pre-configured, specialized microprocessor, for example) that is capable of analyzing the digital form of the returned signal and generating the desired return data (i.e., range calculation, speed, characterization of the targeted object, or the like). In some instances, the control signal input C applied to encoder 25 is also applied as an input to signal processor 38 to provide for proper synchronization between channel assignments (i.e., transmitted output signal for "channel 1" will be associated with reflected signal for "channel 1", the channel assignments controlled by signal C).

Figure 2:
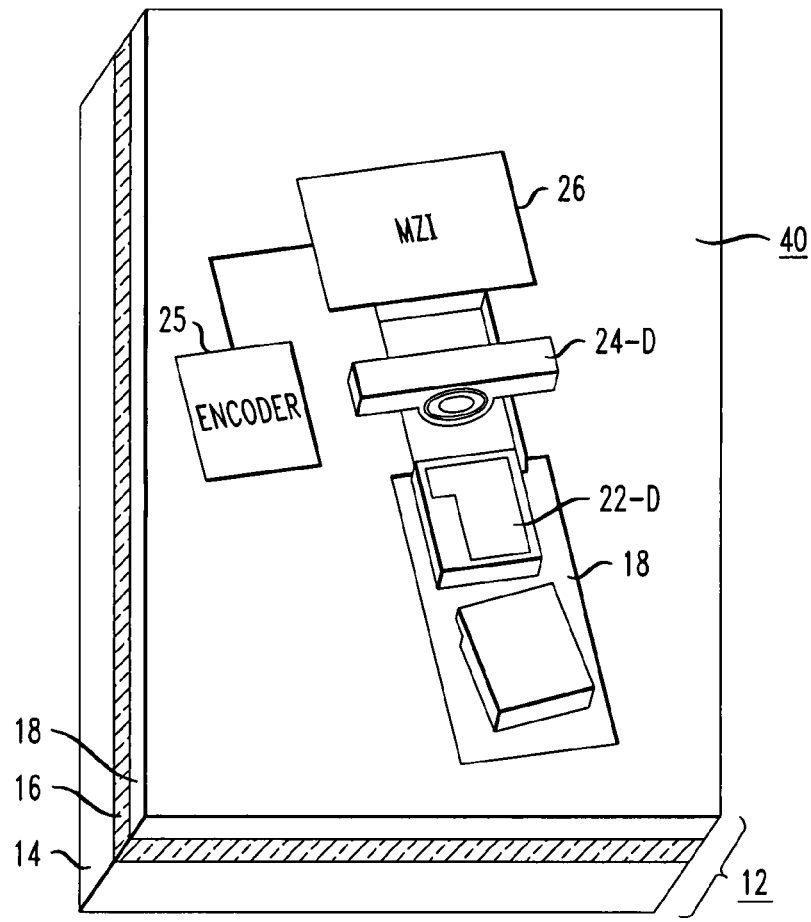
FIG. 2 illustrates an exemplary optical transmitting portion of the LIDAR system utilizing a discrete laser source and associated discrete collimating lens.

In most cases, laser source 22 will comprise a separate, discrete component that is mounted on top surface 40 of SOI structure 12 (either SOI layer 18, or another layer formed thereover) and positioned (either through active or passive coupling operations) such that its output signal is directed through collimating lens 24. Collimating lens 24 may itself be a discrete component, or formed within SOI layer 18. The former arrangement is illustrated in FIG. 2, which illustrates an exemplary discrete laser source 22-D and associated discrete collimating lens 24-D. Discrete collimating lens 24-D is shown as being fixed along a cavity 17 formed through SOI structure 12, where lens 24-D is adjustably positioned to couple the maximum amount optical energy into modulator 26.

Figure 3:
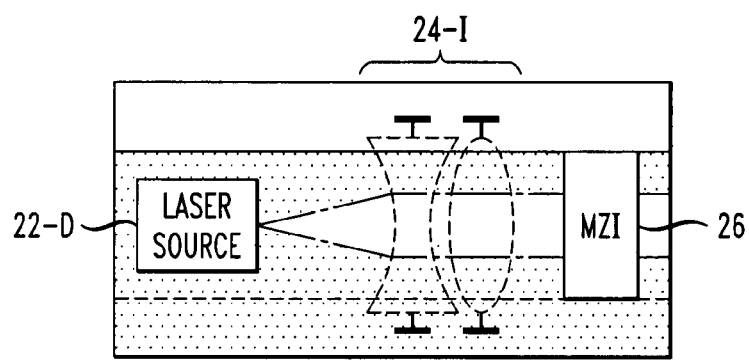
FIG. 3 illustrates an alternative transmitting portion, utilizing a discrete laser source and an integrated collimating lens, formed as a portion of the SOI layer.

The latter arrangement is illustrated in FIG. 3, which is a top view of a portion of LIDAR transmitter 20, showing the use of discrete laser source 22-D with a lens created directly within SOI structure 12. As shown, collimating lens 24-I is formed as an integral portion of SOI layer 18. In this case, proper doping and electrical control of free carrier distribution within the selected portion of SOI layer 18 within the region of collimating lens 24-I will achieve the desired degree of collimation of the output signal from the laser source.

Figure 4:
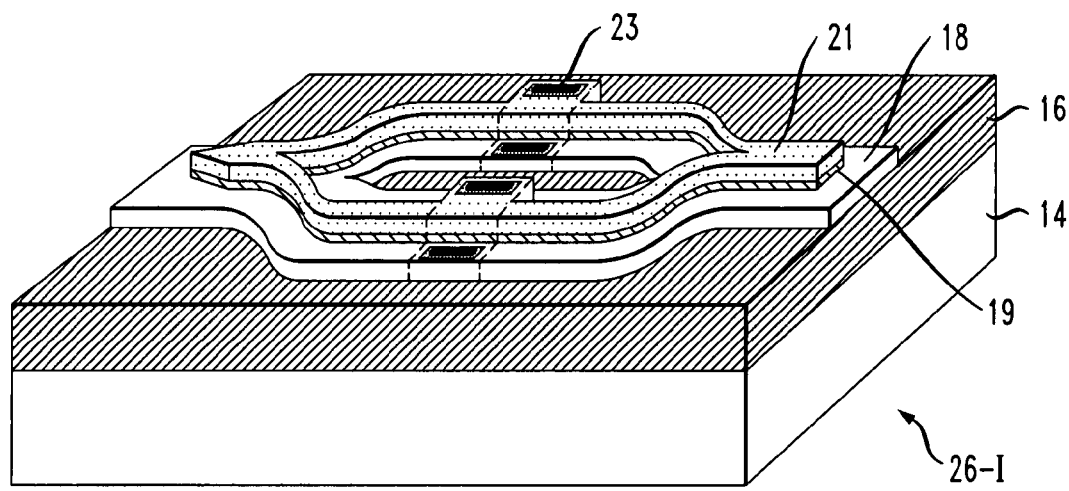
FIG. 4 illustrates a portion of an SOI structure formed to include an exemplary Mach-Zehnder interferometer portion of the LIDAR system of the present invention.

In similar form, modulator 26 may also be fabricated as an integral component of SOI structure 10, where FIG. 4 illustrates a portion of SOI structure 12 that includes an exemplary Mach-Zehnder interferometer 26-I which comprises waveguiding regions formed within SOI layer 18, with an overlying guiding structure comprising two separate materials: a thin oxide layer 19, and a covering layer of polysilicon 21. A plurality of electrodes 23 are disposed as shown, and coupled to encoder 25-I, an "integrated" version of encoder 25 (see FIG. 5), to provide the desired electrical input to the modulator structure. Instead of being directly incorporated into SOI structure 12, modulator 26 may be fabricated on a separate chip, which is thereafter mounted on SOI structure 12 and electrically and optically coupled thereto.

Figure 5:
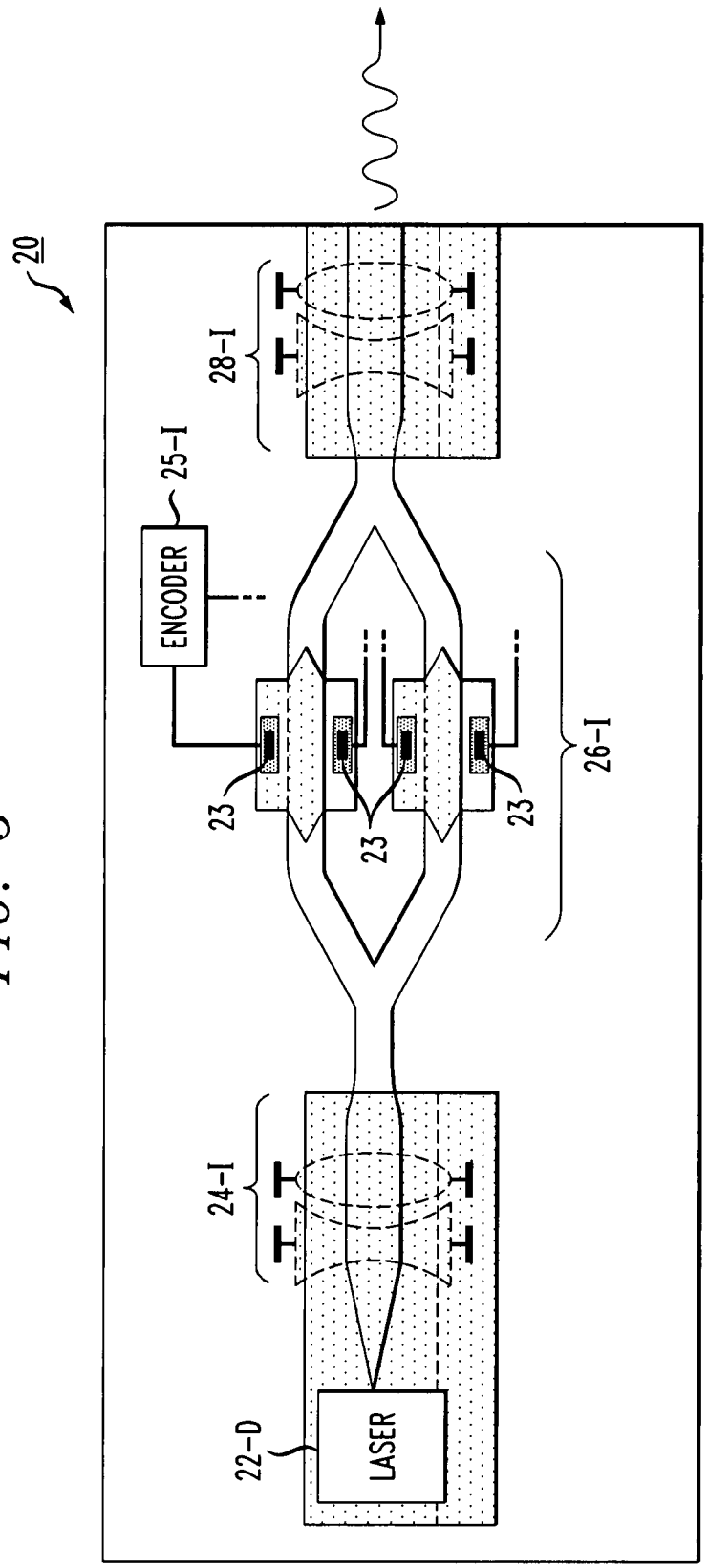
FIG. 5 is a top view of an exemplary integrated arrangement for a LIDAR transmitter formed in accordance with the present invention.

FIG. 5 is a top view of an exemplary integrated arrangement for LIDAR transmitter 20 of the present invention. As shown, discrete laser component 22-D is used to provide the optical signal, which is thereafter passed through integral lens component 24-I. The optical signal from the output of lens 24 is coupled into the input of modulator 26-I. The electrical ("data") input signal to modulator 26-I is provided by encoder 25-I, which is an electronic component that may be formed within SOI structure 12 utilizing well-known CMOS fabrication processes. The modulated output signal is thereafter collimated by an output integral lens 28-I and is launched into "free space" (or any suitable optical transmission medium) toward a designated target.

Figure 6:
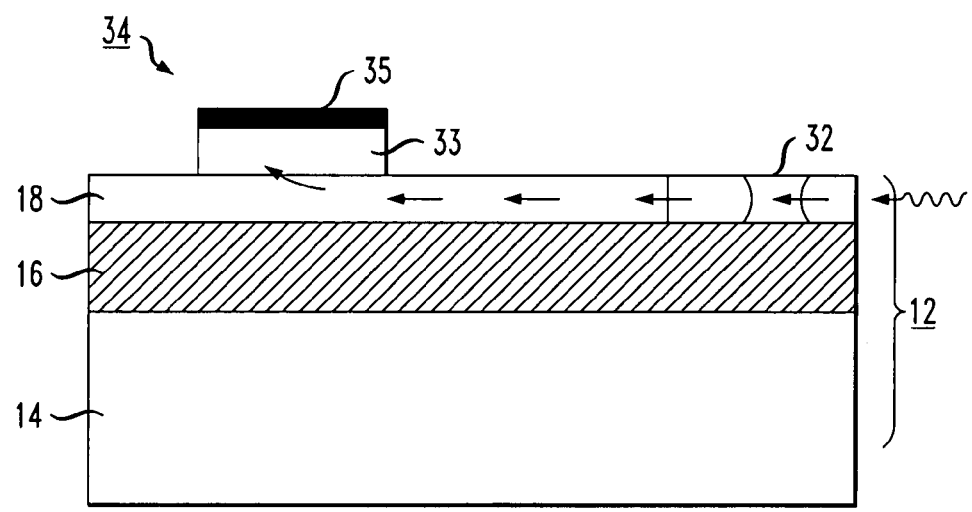
FIG. 6 illustrates a portion of an exemplary SOI structure 12 utilized to form a portion of the LIDAR receiving arrangement.

In similar fashion, the various components comprising LIDAR receiver 30 may be incorporated within SOI structure 12, thus forming an extremely compact and efficient LIDAR system. FIG. 6 illustrates a portion of SOI structure 12 utilized to form an exemplary focusing lens 32 and associated photodetector 34. As with the case for LIDAR transmitter 20, focusing lens 32 may comprise either a discrete component or, preferably and as shown in FIG. 6, an integral component of SOI layer 18. In the formation of an exemplary (integrated) photodetector 34, a layer 33 of germanium is disposed over a portion of SOI layer 18 in order to collector a substantial portion of the returned/reflected optical signal. A metal contact arrangement 35 is coupled to germanium layer 33, where an electrical signal path is then provided from photodetector 34 to transimpedance amplifier 36 (not shown). Various other detector arrangements, including in-line detector arrangements, discrete photodetecting devices, or integrated arrangements utilizing other photosensitive materials, may be used in place of this exemplary germanium detector.

Figure 7:
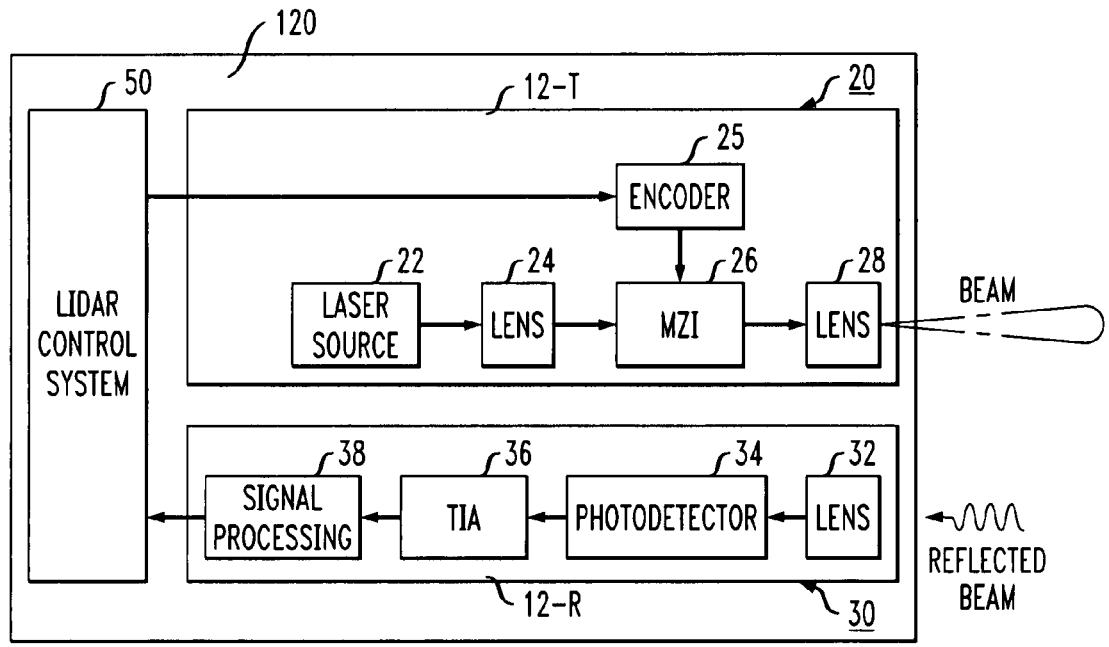
FIG. 7 illustrates an exemplary multi-module SOI-based LIDAR system formed in accordance with the present invention.

As mentioned above, the various components forming LIDAR receiver 30 may be formed within the same substrate as that used to form LIDAR transmitter 20. In an alternative embodiment, a multi-module arrangement may be implemented. FIG. 7 illustrates an exemplary configuration of one such arrangement, where LIDAR transmitter 20 is formed within a first SOI structure 12-T and LIDAR receiver 30 is formed within a second SOI structure 12-R. SOI structures 12-T and 12-R are then mounted to a common substrate platform 120. As shown in this particular embodiment, a separate LIDAR control system 50 is also mounted on substrate platform 120 and is utilized to both generate the input signals supplied to encoder 25 and analyze the return signals generated by signal processor 38. The various modules may be interconnected using various known techniques well-known in the art, such as flip-chip attachment or direct wire-bonding.

Figure 8:
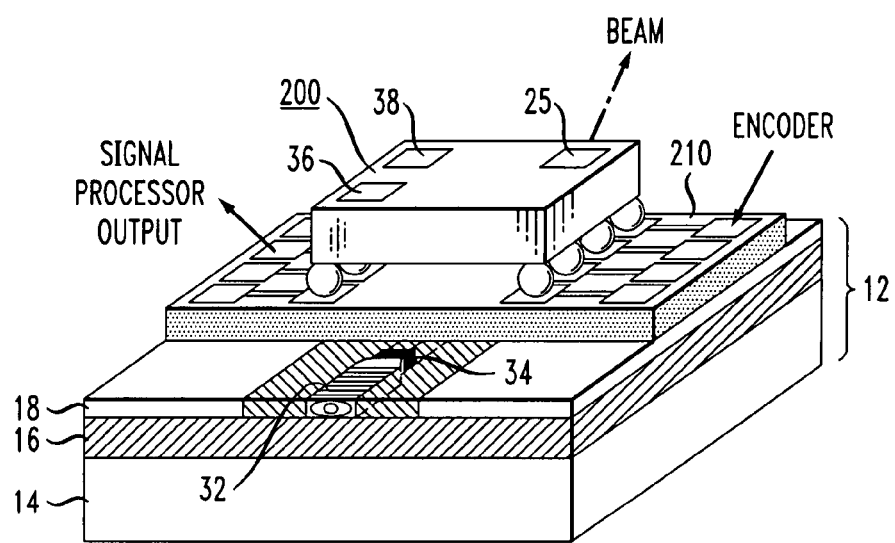
FIG. 8 is an isometric view of an alternative multi-module LIDAR system of the present invention.

FIG. 8 is an isometric view of an alternative multi-module LIDAR system of the present invention. In this particular embodiment, the input and output optical components (laser source 22, lenses 24, 28 and 32, modulator 26 and detector 34) are all formed within SOI layer 18, using the arrangements discussed above and particularly illustrated in FIGS. 5 and 6. Hidden in this view is the location of various optical components associated with LIDAR transmitter 20. In this embodiment, the various electronic elements required to complete the system are formed within a separate integrated circuit chip 200. In particular, circuit chip 200 is formed to include encoder 25, transimpedance amplifier 36 and signal processor 38. As shown, circuit chip 200 is mounted (e.g., wirebonded or flip-chip attached) to a conducting substrate 210, which provides electrical connections between SOI layer 18 of SOI structure 12 and circuit chip 200.

Figure 9:
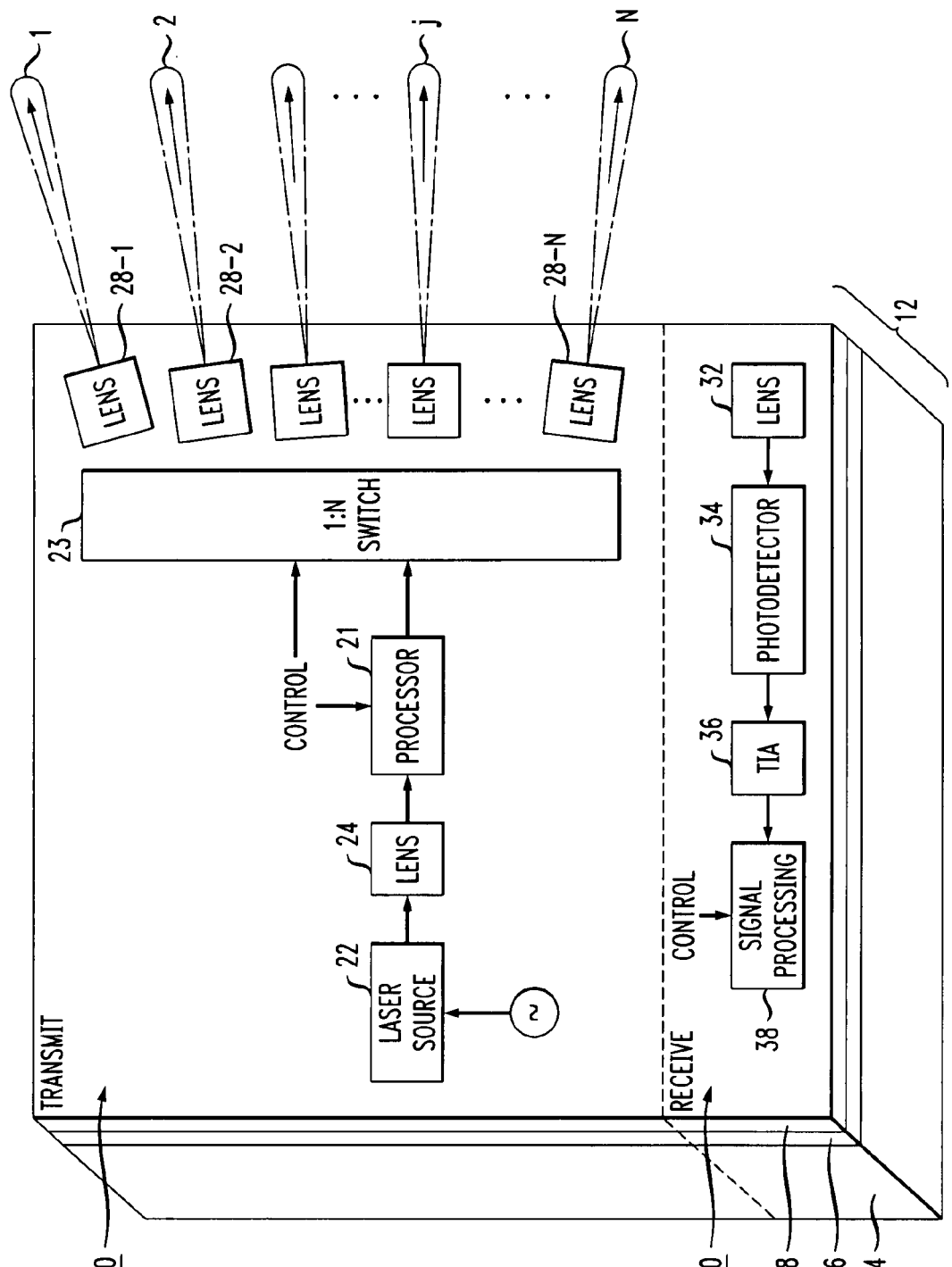
FIG. 9 illustrates an exemplary wide field-of-view embodiment of the present invention.

As mentioned above, an advantage of the arrangement of the present invention is the ability to integrate the various components onto a single substrate. This integration allows for a multiple number of such systems to be combined and form a multiple output unit that is still relatively compact and portable, yet is capable of covering a wide field of view. FIG. 9 illustrates an exemplary wide field-of-view embodiment of the present invention that is capable of being integrated within a single SOI structure 12. As with the arrangements discussed above, LIDAR transmitter 20 includes laser source 22 and associated collimating lens 24 (either discrete or integrated within SOI structure 12). In this particular embodiment, the output from lens 24 is passed through an optical processor 21 and applied as an input to a 1:N switch 23. Optical processor 21 may comprise an electrical encoder (such as encoder 25) and an associated optical modulator (such as MZI 26), or any other suitable arrangement for applying "in-line" optical encoding to the output from laser source 22. Indeed, one embodiment may utilize direct modulation of laser source 22 and thus eliminate the need for a separate optical processor element.

Figure 10:
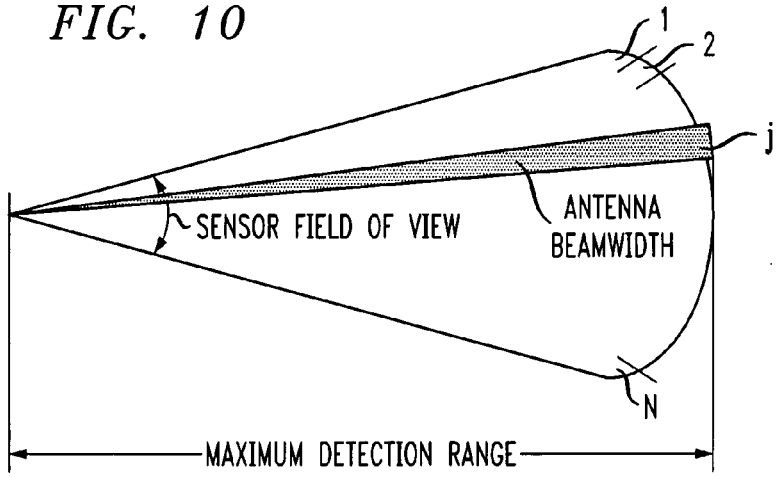
FIG. 10 illustrates the entire field of view that may be scanned with an arrangement as shown in FIG. 9.

In any of the variations of this embodiment, the encoded optical output signal is then applied as an input to 1:N optical switch 23. As shown in FIG. 9, optical switch 23 is utilized to direct the generated optical signal into one of N available output ports. A plurality of N collimating lenses 28-1, 28-2, . . . , 28-N are incorporated with SOI structure 12 and disposed along the separate waveguiding paths at the output of optical switch 23. Optical switch 23 may comprise any well-known arrangement capable of providing optical switching (one arrangement comprises a plurality of cascaded interferometer elements), where by energizing the switches in sequence the appearance of the optical output signal may be switched among the various output ports. In one embodiment, a time division switching scheme may be employed so that the beam "sweeps" through the entire field of view in a controlled, sequential fashion. In such an arrangement, the control signal used to control the switching of the optical signal is also applied as an input to LIDAR receiver 30 so as to maintain a correlation between the individual transmitted beams and the individual reflected signals. FIG. 10 illustrates the entire field of view that may be scanned with an arrangement as shown in FIG. 9.

Figure 11:
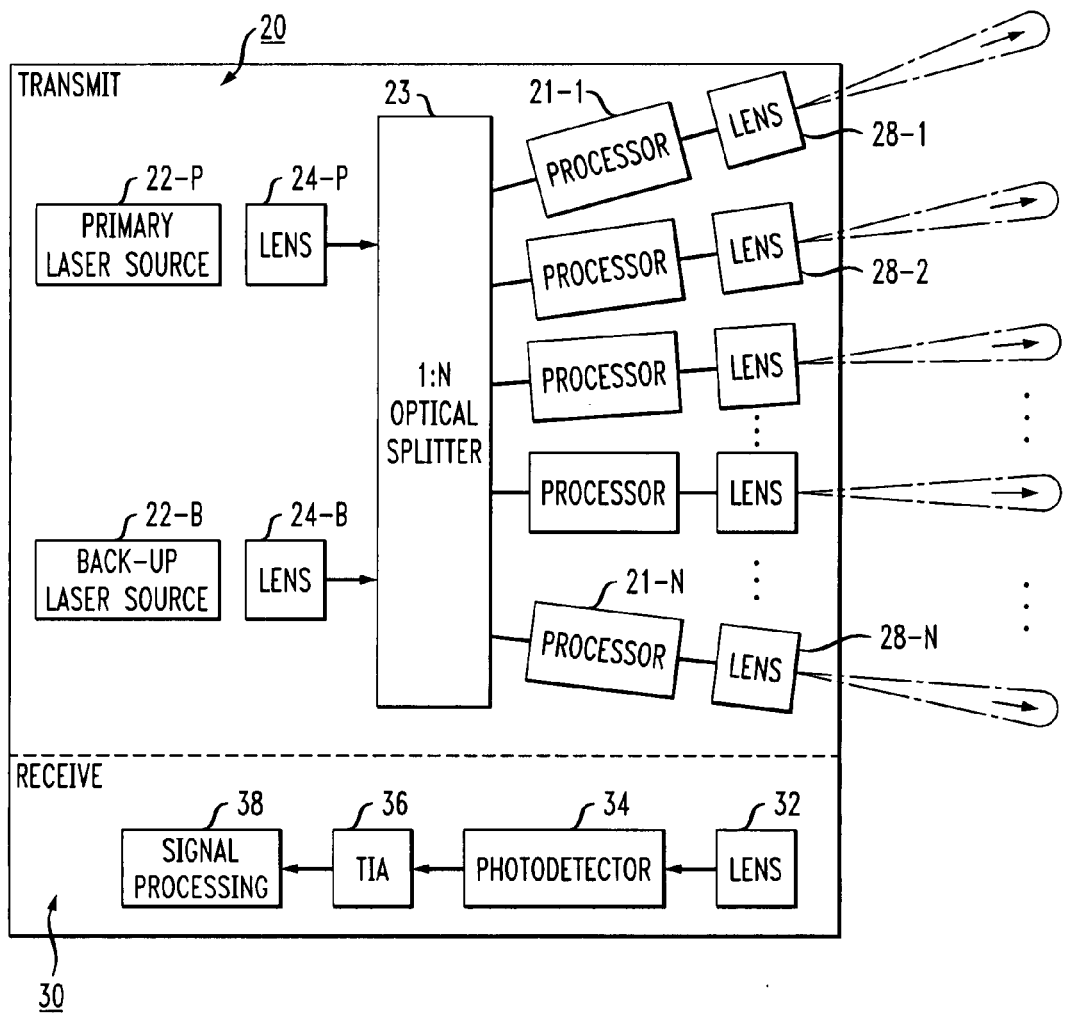
FIG. 11 illustrates an alternative embodiment of an exemplary wide field-of-view arrangement that may be formed in accordance with the present invention.

FIG. 11 illustrates an alternative embodiment of an exemplary wide field-of-view arrangement that may be formed in accordance with the present invention. In this case, LIDAR transmitter 20 includes a pair of laser sources, designated as 22-P ("primary") and 22-B ("back-up"), where laser 22-B is energized only upon failure of primary source 22-P. Similar to the arrangements described above, each laser source 22 has an associated collimating lens 24 (either discrete or integrated within SOI structure 12). In this particular embodiment, the outputs from lenses 24-P and 24-B are applied as an input to a 1:N splitter 27, where the single input optical signal is divided into a plurality of N separate signals, each applied as an input to a separate optical processor 21, arranged as shown in FIG. 11. Each separate optical processor is utilized to "steer" the beam in a pre-defined direction, where by switching through the plurality of output beams, the arrangement as shown is capable of "sweeping" across a relatively wide field of view without requiring physical switching of a single beam, as is utilized in the embodiment of FIG. 9. Although not illustrated in particular, it is to be understood that a plurality of optical signals operating at different wavelengths may be utilized and associated with the plurality of separate beams, providing a wavelength diversity arrangement.

Figure 12:
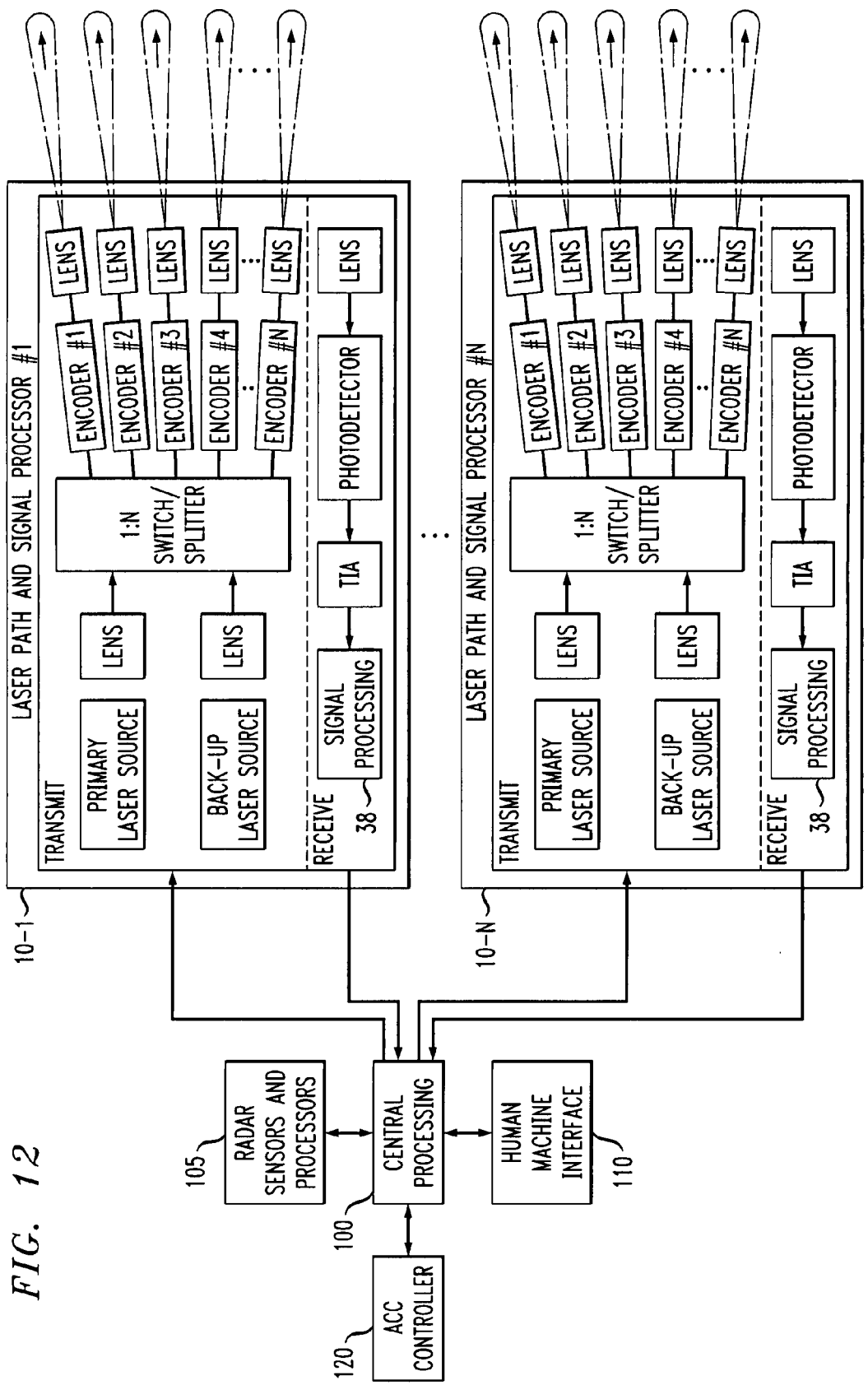
FIG. 12 illustrates an exemplary automotive collision avoidance system with an integrated automatic cruise control arrangement utilizing an integrated LIDAR system of the present invention.

FIG. 12 illustrates an exemplary automotive collision avoidance system with an integrated automatic cruise control arrangement utilizing an integrated LIDAR system of the present invention as described above. In this case, a plurality of separate LIDAR systems 10-1, . . . , 10-N are utilized and positioned at various separate locations on a car. Inasmuch as the systems 10 are relatively small as a result of the integration advantages of the present invention, they do not require large spaces, or draw significant power from the car's battery. Each separate LIDAR system 10 constantly performs scanning operations, feeding the return information from signal processors 36 to a central processor 100 within the car. By comparing the returning data, along with input data from other sources, such as a radar system 105, central processor 100 can perform a variety of functions, such as warning a driver about an impending collision through a human/machine interface 110. When necessary, the information supplied to central processor 100 may be transmitted to a cruise controller module 120 to automatically disengage the cruise control process. Various other options are available and are considered to fall within the scope of the present invention.

It is to be understood that the above-described arrangements are merely illustrative of the many possible specific embodiments which can be devices to represent application of the principles of the invention. Numerous and varied other arrangements can be devised in accordance with these principles by those skilled in the art without departing from the spirit and scope of the invention.

What is claimed is:

1. An integrated LIDAR system formed within a silicon-on-insulator (SOI) structure, the integrated LIDAR system comprising
   a LIDAR transmitter disposed on the SOI structure and comprising a laser source, a focusing lens coupled to the output of the laser source, an optical modulator disposed to receive the focused output from the focusing lens and a collimating lens disposed at the output of the optical modulator for out-coupling the optical signal from the SOI structure and directing the optical signal to an intended target, the LIDAR transmitter further comprising optical waveguides formed within a surface silicon layer of the SOI structure to provide coupling between the laser source, focusing lens, optical modulator and collimating lens; and
   a LIDAR receiver disposed on the SOI structure and comprising a focusing lens for receiving a reflected signal from the intended target, a photodetector disposed to intercept the focused optical signal captured by the focusing lens and generate an electrical output signal, and a signal processing arrangement for analyzing the generated electrical output signal and determining information about the intended target.

2. An integrated LIDAR system as defined in claim 1 wherein the focusing lens and the collimating lens of the LIDAR transmitter are integrated within the SOI structure and formed within the surface silicon layer thereof.

3. An integrated LIDAR system as defined in claim 1 wherein at least a portion of the optical modulator of the LIDAR transmitter is integrated within the surface silicon layer of the SOI structure.

4. An integrated LIDAR system as defined in claim 1 wherein the optical modulator of the LIDAR transmitter comprises a Mach-Zehnder interferometer integrated within the SOI structure and an associated electrical encoder, the electrical encoder for supplying an electrical modulating signal to the Mach-Zehnder interferometer to control the modulation of the optical output signal therefrom.

5. An integrated LIDAR system as defined in claim 4 wherein the electrical encoder of the LIDAR transmitter is integrated within the SOI structure.

6. An integrated LIDAR system as defined in claim 4 wherein the electrical encoder of the LIDAR transmitter is formed within a separate integrated circuit module, electrically connected to the SOI structure.

7. An integrated LIDAR system as defined in claim 1 wherein the focusing lens of the LIDAR receiver is integrated within the SOI structure and formed within the surface silicon layer thereof.

8. An integrated LIDAR system as defined in claim 1 wherein the photodetector of the LIDAR receiver is integrated within the SOI structure and formed within the surface silicon layer thereof.

9. An integrated LIDAR system as defined in claim 1 wherein the photodetector of the LIDAR received comprises a separate, discrete component disposed along and optically coupled to the surface silicon layer of the SOI structure.

10. An integrated LIDAR system as defined in claim 1 wherein the LIDAR transmitter is integrated within a first SOI module and the LIDAR receiver is integrated within a second SOI module, with the first and second SOI modules mounted on a common silicon substrate, forming the SOI structure.

11. An integrated LIDAR system as defined in claim 1 wherein the LIDAR transmitter further comprises a 1:N optical switch disposed beyond the optical modulator, and a plurality of N output optical waveguides, the 1:N optical switch for directing the transmitted output signal along various ones of the plurality of N output optical waveguides, directing the output optical signal across a plurality of N intended target areas.

12. An integrated LIDAR system as defined in claim 11 wherein the 1:N optical switch is an integrated switch formed within at least the surface silicon layer of the SOI structure.

13. An integrated LIDAR system as defined in claim 1 wherein the LIDAR transmitter further comprises a 1:N optical splitter disposed beyond the optical modulator, and a plurality of N output optical waveguides, where the 1:N optical splitter couples a portion of the optical signal into each one of the plurality of N output optical waveguides, generating a wide field-of-view optical output signal.

14. An integrated LIDAR system as defined in claim 13 wherein the 1:N optical splitter is an integrated splitter formed within at least the surface silicon layer of the SOI structure.

* * * * *